United States Patent
Morris et al.

(10) Patent No.: US 11,127,689 B2
(45) Date of Patent: Sep. 21, 2021

(54) SEGMENTED SHIELDING USING WIREBONDS

(71) Applicant: Qorvo US, Inc., Greensboro, NC (US)

(72) Inventors: Thomas Scott Morris, Lewisville, NC (US); Brian H. Calhoun, Oak Ridge, NC (US); W. Kent Braxton, Greensboro, NC (US); Domingo Farias, Methuen, MA (US); Joseph Edward Geniac, Greensboro, NC (US); Kyle Sullivan, Greensboro, NC (US); Donald Joseph Leahy, Kernersville, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/372,910

(22) Filed: Apr. 2, 2019

(65) Prior Publication Data

US 2019/0371738 A1 Dec. 5, 2019

Related U.S. Application Data

(60) Provisional application No. 62/679,178, filed on Jun. 1, 2018.

(51) Int. Cl.
*H01L 23/552* (2006.01)
*H01L 23/00* (2006.01)
*H01L 21/56* (2006.01)

(52) U.S. Cl.
CPC .......... *H01L 23/552* (2013.01); *H01L 21/565* (2013.01); *H01L 24/43* (2013.01);
(Continued)

(58) Field of Classification Search
CPC .. H01L 23/552; H01L 23/3121; H01L 21/565
See application file for complete search history.

(56) References Cited

U.S. PATENT DOCUMENTS

| 3,566,190 A | 2/1971 | Huebner et al. |
| 3,907,616 A | 9/1975 | Wiemer |

(Continued)

FOREIGN PATENT DOCUMENTS

| CN | 1855451 A | 11/2006 |
| EP | 1715520 B1 | 10/2006 |

(Continued)

OTHER PUBLICATIONS

Notice of Allowance for U.S. Appl. No. 14/447,847, dated Feb. 29, 2016, 7 pages.

(Continued)

*Primary Examiner* — Changhyun Yi
(74) *Attorney, Agent, or Firm* — Withrow & Terranova, PLLC

(57) ABSTRACT

The present disclosure relates to segmented shielding using wirebonds. In an exemplary aspect, a shield is formed from a series of wires (e.g., wirebonds) to create a wall and/or shielded compartment in an integrated circuit (IC) module. The wires can be located in any area within the IC module. The IC module may be overmolded with an insulating mold compound, and a top surface of the insulating mold can be ground or otherwise removed to expose ends of the wires to a shield layer which surrounds the insulating mold. Some examples may further laser ablate or otherwise form cavities around the ends of the wires to create stronger bonding between the wires of the shield and the shield layer.

20 Claims, 4 Drawing Sheets

(52) U.S. Cl.
CPC .............. *H01L 24/49* (2013.01); *H01L 24/85* (2013.01); *H01L 2224/45147* (2013.01); *H01L 2224/45644* (2013.01); *H01L 2224/45664* (2013.01); *H01L 2224/85951* (2013.01); *H01L 2924/3025* (2013.01)

(56) References Cited

U.S. PATENT DOCUMENTS

| | | |
|---|---|---|
| 3,907,617 A | 9/1975 | Zwernemann |
| 4,680,676 A | 7/1987 | Petratos et al. |
| 5,329,695 A | 7/1994 | Traskos et al. |
| 5,389,738 A | 2/1995 | Piosenka et al. |
| 5,406,630 A | 4/1995 | Piosenka et al. |
| 5,436,203 A | 7/1995 | Lin |
| 5,459,368 A | 10/1995 | Onishi et al. |
| 5,473,512 A | 12/1995 | Degani et al. |
| 5,592,391 A | 1/1997 | Muyshondt et al. |
| 5,623,293 A | 4/1997 | Aoki |
| 5,639,989 A | 6/1997 | Higgins, III |
| 5,646,828 A | 7/1997 | Degani et al. |
| 5,650,659 A | 7/1997 | Mostafazadeh et al. |
| 5,870,289 A | 2/1999 | Tokuda et al. |
| 5,977,626 A | 11/1999 | Wang et al. |
| 6,004,180 A | 12/1999 | Knall et al. |
| 6,011,698 A | 1/2000 | Buehler |
| 6,137,693 A | 10/2000 | Schwiebert et al. |
| 6,150,193 A | 11/2000 | Glenn |
| 6,163,454 A | 12/2000 | Strickler |
| 6,297,957 B1 | 10/2001 | Johnson et al. |
| 6,429,386 B2 | 8/2002 | DiBene, II et al. |
| 6,448,583 B1 | 9/2002 | Yoneda et al. |
| 6,448,793 B1 | 9/2002 | Barratt et al. |
| 6,466,416 B1 | 10/2002 | Honjo et al. |
| 6,515,870 B1 | 2/2003 | Skinner et al. |
| 6,534,859 B1 | 3/2003 | Shim et al. |
| 6,538,196 B1 | 3/2003 | MacDonald et al. |
| 6,590,152 B1 | 7/2003 | Horio et al. |
| 6,599,779 B2 | 7/2003 | Shim et al. |
| 6,613,660 B2 | 9/2003 | Kahlert et al. |
| 6,633,073 B2 | 10/2003 | Rezvani et al. |
| 6,657,592 B2 | 12/2003 | Dening et al. |
| 6,707,168 B1 | 3/2004 | Hoffman et al. |
| 6,717,485 B2 | 4/2004 | Kolb et al. |
| 6,791,795 B2 | 9/2004 | Ohtomo et al. |
| 6,807,731 B2 | 10/2004 | Brandenburg et al. |
| 6,825,560 B1 | 11/2004 | Walker et al. |
| 6,838,353 B1 | 1/2005 | Nuytkens et al. |
| 6,887,787 B2 | 5/2005 | Farnworth |
| 6,894,229 B1 | 5/2005 | Cheah |
| 6,900,383 B2 | 5/2005 | Babb et al. |
| 6,946,324 B1 | 9/2005 | McLellan et al. |
| 6,947,295 B2 | 9/2005 | Hsieh |
| 6,998,532 B2 | 2/2006 | Kawamoto et al. |
| 7,030,469 B2 | 4/2006 | Mahadevan et al. |
| 7,042,398 B2 | 5/2006 | Tang et al. |
| 7,087,461 B2 | 8/2006 | Park et al. |
| 7,087,462 B1 | 8/2006 | Park et al. |
| 7,109,410 B2 | 9/2006 | Arnold et al. |
| 7,109,817 B2 | 9/2006 | Kolb et al. |
| 7,125,744 B2 | 10/2006 | Takehara et al. |
| 7,148,574 B2 | 12/2006 | Lee et al. |
| 7,187,060 B2 | 3/2007 | Usui |
| 7,227,719 B2 | 6/2007 | Sasaki et al. |
| 7,259,041 B2 | 8/2007 | Stelzl et al. |
| 7,330,084 B2 | 2/2008 | Lee et al. |
| 7,342,303 B1 | 3/2008 | Berry et al. |
| 7,348,663 B1 | 3/2008 | Kirloskar et al. |
| 7,433,203 B1 | 10/2008 | Yi et al. |
| 7,443,693 B2 | 10/2008 | Arnold et al. |
| 7,445,968 B2 | 11/2008 | Harrison et al. |
| 7,451,539 B2 | 11/2008 | Morris et al. |
| 7,478,474 B2 | 1/2009 | Koga |
| 7,488,903 B2 | 2/2009 | Kawagishi et al. |
| 7,514,772 B2 | 4/2009 | Kobayashi et al. |
| 7,548,430 B1 | 6/2009 | Huemoeller et al. |
| 7,598,606 B2 | 10/2009 | Chow et al. |
| 7,633,170 B2 | 12/2009 | Yang et al. |
| 7,633,765 B1 | 12/2009 | Scanlan et al. |
| 7,635,918 B2 | 12/2009 | Yoshida |
| 7,636,245 B2 | 12/2009 | Clancy et al. |
| 7,643,311 B2 | 1/2010 | Coffy |
| 7,651,889 B2 | 1/2010 | Tang et al. |
| 7,665,201 B2 | 2/2010 | Sjoedin |
| 7,671,451 B2 | 3/2010 | Lee et al. |
| 7,700,411 B2 | 4/2010 | Yang et al. |
| 7,701,728 B2 | 4/2010 | Hatanaka et al. |
| 7,745,910 B1 | 6/2010 | Olson et al. |
| 7,772,046 B2 | 8/2010 | Pagaila et al. |
| 7,829,981 B2 | 11/2010 | Hsu |
| 7,902,643 B2 | 3/2011 | Tuttle |
| 7,902,644 B2 | 3/2011 | Huang et al. |
| 7,928,538 B2 | 4/2011 | Salzman |
| 7,989,928 B2 | 8/2011 | Liao et al. |
| 8,013,258 B2 | 9/2011 | Wu |
| 8,053,872 B1 | 11/2011 | Swan et al. |
| 8,061,012 B2 | 11/2011 | Carey et al. |
| 8,062,930 B1 | 11/2011 | Shah et al. |
| 8,071,431 B2 | 12/2011 | Hoang et al. |
| 8,084,300 B1 | 12/2011 | San Antonio et al. |
| 8,093,690 B2 | 1/2012 | Ko et al. |
| 8,093,691 B1 | 1/2012 | Fuentes et al. |
| 8,110,441 B2 | 2/2012 | Chandra et al. |
| 8,186,048 B2 | 5/2012 | Leahy et al. |
| 8,220,145 B2 | 7/2012 | Hiner et al. |
| 8,268,677 B1 | 9/2012 | Pagaila |
| 8,296,938 B2 | 10/2012 | Carey et al. |
| 8,296,941 B2 | 10/2012 | Hiner et al. |
| 8,349,659 B1 | 1/2013 | Swan et al. |
| 8,359,739 B2 | 1/2013 | Carey et al. |
| 8,373,264 B2 | 2/2013 | Welch et al. |
| 8,409,658 B2 | 4/2013 | Hiner et al. |
| 8,410,584 B2 | 4/2013 | An et al. |
| 8,434,220 B2 | 5/2013 | Rao et al. |
| 8,507,319 B2 | 8/2013 | Chow et al. |
| 8,552,539 B1 | 10/2013 | Foster |
| 8,614,899 B2 | 12/2013 | Madsen et al. |
| 8,664,774 B1 | 3/2014 | Mosinskis |
| 8,720,051 B2 | 5/2014 | Leahy et al. |
| 8,748,230 B2 | 6/2014 | Welch et al. |
| 8,835,226 B2 | 9/2014 | Morris et al. |
| 8,861,221 B2 | 10/2014 | Pagaila |
| 8,959,762 B2 | 2/2015 | Leahy et al. |
| 8,987,889 B2 | 3/2015 | Welch et al. |
| 9,048,020 B2 | 6/2015 | Calvillo Cortes et al. |
| 9,137,934 B2 | 9/2015 | Morris et al. |
| 9,450,547 B2 | 9/2016 | Szymanowski et al. |
| 9,589,927 B2 | 3/2017 | Szymanowski et al. |
| 9,627,230 B2 | 4/2017 | Carey et al. |
| 9,661,739 B2 | 5/2017 | Leahy et al. |
| 9,935,075 B2 | 4/2018 | Huang et al. |
| 9,978,691 B2 | 5/2018 | Kuo et al. |
| 2002/0036345 A1 | 3/2002 | Iseki et al. |
| 2002/0118529 A1 | 8/2002 | Babin et al. |
| 2002/0142516 A1 | 10/2002 | Light |
| 2003/0011049 A1 | 1/2003 | Nuytkens et al. |
| 2003/0048581 A1 | 3/2003 | Ohtomo et al. |
| 2003/0062541 A1 | 4/2003 | Warner |
| 2003/0090883 A1 | 5/2003 | Asahi et al. |
| 2003/0151122 A1 | 8/2003 | Davies |
| 2004/0063246 A1 | 4/2004 | Karnezos |
| 2004/0103509 A1 | 6/2004 | Bidard et al. |
| 2004/0104473 A1 | 6/2004 | Farnworth |
| 2004/0178500 A1 | 9/2004 | Usui |
| 2004/0209434 A1 | 10/2004 | Seaford et al. |
| 2004/0214023 A1 | 10/2004 | Park et al. |
| 2004/0222511 A1 | 11/2004 | Zhang |
| 2004/0232536 A1 | 11/2004 | Fukuzumi |
| 2004/0238934 A1 | 12/2004 | Warner et al. |
| 2005/0046001 A1 | 3/2005 | Warner |
| 2005/0153061 A1 | 7/2005 | Nuytkens et al. |
| 2006/0033184 A1 | 2/2006 | Park et al. |
| 2006/0113642 A1 | 6/2006 | Kajiki et al. |
| 2006/0119448 A1 | 6/2006 | Lee et al. |
| 2006/0151203 A1 | 7/2006 | Krueger et al. |

(56) References Cited

U.S. PATENT DOCUMENTS

| | | |
|---|---|---|
| 2006/0223577 A1 | 10/2006 | Ouzillou |
| 2006/0244131 A1 | 11/2006 | Kobayashi et al. |
| 2006/0266547 A1 | 11/2006 | Koga |
| 2006/0273467 A1 | 12/2006 | Brandenburg et al. |
| 2006/0273813 A1 | 12/2006 | Coffy |
| 2006/0274517 A1 | 12/2006 | Coffy |
| 2007/0030661 A1 | 2/2007 | Morris et al. |
| 2007/0042593 A1 | 2/2007 | Lee et al. |
| 2007/0045248 A1 | 3/2007 | Schein et al. |
| 2007/0058748 A1 | 3/2007 | Kim et al. |
| 2007/0062637 A1 | 3/2007 | Sjoedin |
| 2007/0155053 A1 | 7/2007 | Karnezos |
| 2007/0163802 A1 | 7/2007 | Monthei |
| 2007/0200210 A1 | 8/2007 | Zhao et al. |
| 2007/0221399 A1 | 9/2007 | Nishizawa et al. |
| 2007/0222697 A1 | 9/2007 | Caimi et al. |
| 2007/0290322 A1 | 12/2007 | Zhao et al. |
| 2008/0019112 A1 | 1/2008 | Hatanaka et al. |
| 2008/0054421 A1 | 3/2008 | Dimaano et al. |
| 2008/0067645 A1 | 3/2008 | Foong et al. |
| 2008/0108179 A1 | 5/2008 | Mistry et al. |
| 2008/0112151 A1 | 5/2008 | Thompson et al. |
| 2008/0139013 A1 | 6/2008 | Tomura et al. |
| 2008/0142938 A1 | 6/2008 | Chow et al. |
| 2008/0157316 A1 | 7/2008 | Yang |
| 2008/0210462 A1 | 9/2008 | Kawagishi et al. |
| 2008/0224306 A1 | 9/2008 | Yang |
| 2008/0308912 A1 | 12/2008 | Cha et al. |
| 2008/0317188 A1 | 12/2008 | Staszewski et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1 | 1/2009 | Carey et al. |
| 2009/0002972 A1 | 1/2009 | Carey et al. |
| 2009/0009979 A1 | 1/2009 | Mori et al. |
| 2009/0016039 A1 | 1/2009 | Imamura |
| 2009/0025211 A1 | 1/2009 | Hiner et al. |
| 2009/0051011 A1 | 2/2009 | Usami |
| 2009/0066588 A1 | 3/2009 | Cheng et al. |
| 2009/0067149 A1 | 3/2009 | Bogursky et al. |
| 2009/0072357 A1 | 3/2009 | Tang et al. |
| 2009/0072364 A1 | 3/2009 | Punzalan et al. |
| 2009/0079041 A1 | 3/2009 | Huang et al. |
| 2009/0140402 A1 | 6/2009 | Ohtani |
| 2009/0227273 A1 | 9/2009 | McCune, Jr. |
| 2009/0233562 A1 | 9/2009 | Kim et al. |
| 2009/0270054 A1 | 10/2009 | Ridgers et al. |
| 2009/0302438 A1 | 12/2009 | Chauhan et al. |
| 2009/0315156 A1 | 12/2009 | Harper |
| 2010/0032815 A1 | 2/2010 | An et al. |
| 2010/0051343 A1 | 3/2010 | Lam |
| 2010/0052125 A1* | 3/2010 | Sasaki ............... H01L 21/82 257/676 |
| 2010/0123233 A1 | 5/2010 | Yoon et al. |
| 2010/0199492 A1 | 8/2010 | Hiner et al. |
| 2010/0207258 A1 | 8/2010 | Eun et al. |
| 2010/0224992 A1 | 9/2010 | McConnelee et al. |
| 2010/0279730 A1 | 11/2010 | Ortiz |
| 2011/0003435 A1 | 1/2011 | Tang et al. |
| 2011/0014880 A1 | 1/2011 | Nicolson et al. |
| 2011/0017263 A1 | 1/2011 | Gibson et al. |
| 2011/0038136 A1 | 2/2011 | Carey et al. |
| 2011/0084368 A1 | 4/2011 | Hoang et al. |
| 2011/0084378 A1 | 4/2011 | Welch et al. |
| 2011/0085314 A1 | 4/2011 | Franz |
| 2011/0114369 A1 | 5/2011 | Lee et al. |
| 2011/0182048 A1 | 7/2011 | Roethlingshoefer et al. |
| 2011/0225803 A1 | 9/2011 | Hiner et al. |
| 2011/0235282 A1 | 9/2011 | Leahy et al. |
| 2011/0298109 A1 | 12/2011 | Pagaila et al. |
| 2011/0298110 A1 | 12/2011 | Pagaila et al. |
| 2011/0298670 A1 | 12/2011 | Jung et al. |
| 2011/0316657 A1 | 12/2011 | Park et al. |
| 2012/0002377 A1 | 1/2012 | French et al. |
| 2012/0025356 A1 | 2/2012 | Liao et al. |
| 2012/0044653 A1 | 2/2012 | Morris et al. |
| 2012/0074538 A1 | 3/2012 | Tsai et al. |
| 2012/0075821 A1 | 3/2012 | Pagaila |
| 2012/0126378 A1 | 5/2012 | San Antonio et al. |
| 2012/0139640 A1 | 6/2012 | Calvillo Cortes et al. |
| 2012/0182706 A1 | 7/2012 | Siomkos et al. |
| 2012/0217048 A1 | 8/2012 | Leahy et al. |
| 2012/0217624 A1 | 8/2012 | Morris et al. |
| 2012/0218729 A1 | 8/2012 | Carey et al. |
| 2012/0270371 A1 | 10/2012 | DeBar et al. |
| 2012/0286415 A1 | 11/2012 | Sakai et al. |
| 2013/0324069 A1* | 12/2013 | Chen ................ H04B 1/16 455/334 |
| 2014/0077349 A1 | 3/2014 | Higgins, III |
| 2014/0097007 A1 | 4/2014 | Nagai et al. |
| 2014/0182920 A1 | 7/2014 | Yanagisawa et al. |
| 2014/0262442 A1 | 9/2014 | Nomura et al. |
| 2014/0268587 A1 | 9/2014 | Nomura et al. |
| 2014/0307394 A1* | 10/2014 | Lobianco ............ B23K 26/362 361/728 |
| 2014/0340859 A1 | 11/2014 | Morris et al. |
| 2014/0353807 A1 | 12/2014 | Welch |
| 2014/0355222 A1 | 12/2014 | Dang et al. |
| 2015/0091157 A9 | 4/2015 | Chi et al. |
| 2015/0124421 A1 | 5/2015 | Leahy et al. |
| 2015/0170986 A1 | 6/2015 | Szymanowski et al. |
| 2015/0296631 A1 | 10/2015 | Morris et al. |
| 2016/0087588 A1 | 3/2016 | Szymanowski et al. |
| 2016/0148882 A1 | 5/2016 | Kim et al. |
| 2016/0211222 A1 | 7/2016 | Kuo et al. |
| 2017/0117230 A1* | 4/2017 | Kumbhat ............ H01L 25/16 |
| 2017/0118877 A1 | 4/2017 | Kumbhat et al. |
| 2017/0127581 A1 | 5/2017 | Figueredo et al. |
| 2017/0133326 A1 | 5/2017 | Dang et al. |
| 2017/0194281 A1 | 7/2017 | DeLaCruz et al. |
| 2018/0033764 A1 | 2/2018 | Huang et al. |
| 2018/0130755 A1 | 5/2018 | Lee et al. |
| 2020/0008327 A1 | 1/2020 | Lear et al. |
| 2020/0203248 A1 | 6/2020 | Nair et al. |

FOREIGN PATENT DOCUMENTS

| | | |
|---|---|---|
| EP | 1717857 A2 | 11/2006 |
| EP | 1764834 B1 | 3/2009 |
| JP | H11163583 A | 6/1999 |
| JP | 2004207352 A | 7/2004 |
| JP | 2005039007 A | 2/2005 |
| JP | 2005109306 A | 4/2005 |
| JP | 2006332255 A | 12/2006 |
| JP | 2007311396 A | 11/2007 |
| JP | 2011523120 A | 8/2011 |
| JP | 5254446 B2 | 8/2013 |
| KR | 20060113412 A | 11/2006 |
| TW | 201108360 A | 3/2011 |
| TW | 201142965 A | 12/2011 |
| WO | 0035085 A1 | 6/2000 |
| WO | 03058812 A1 | 7/2003 |
| WO | 2004019490 A1 | 3/2004 |
| WO | 2004060034 A1 | 7/2004 |
| WO | 2007060784 A1 | 5/2007 |
| WO | 2007132560 A1 | 11/2007 |
| WO | 2009099699 A1 | 8/2009 |
| WO | 2009144960 A1 | 12/2009 |
| WO | 2010014103 A1 | 2/2010 |
| WO | 2010021262 A1 | 2/2010 |

OTHER PUBLICATIONS

Notice of Allowance for U.S. Appl. No. 14/447,847, dated Mar. 31, 2016, 7 pages.
Corrected Notice of Allowability for U.S. Appl. No. 14/447,847, dated Jul. 15, 2016, 4 pages.
Final Office Action for U.S. Appl. No. 13/906,892, dated Feb. 11, 2016, 10 pages.
Advisory Action for U.S. Appl. No. 13/906,892, dated Jun. 15, 2016, 2 pages.

(56) References Cited

OTHER PUBLICATIONS

Final Office Action for U.S. Appl. No. 13/906,892, dated Aug. 26, 2016, 11 pages.
Advisory Action for U.S. Appl. No. 13/906,892, dated Nov. 28, 2016, 3 pages.
Final Office Action for U.S. Appl. No. 13/906,892, dated Dec. 15, 2016, 11 pages.
Advisory Action for U.S. Appl. No. 13/906,892, dated Mar. 14, 2017, 3 pages.
Non-Final Office Action for U.S. Appl. No. 13/906,892, dated Apr. 3, 2017, 9 pages.
Notice of Allowance for U.S. Appl. No. 13/906,892, dated May 19, 2017, 9 pages.
Non-Final Office Action for U.S. Appl. No. 16/390,761, dated Dec. 27, 2019, 9 pages.
Hearing Notice for Indian Patent Application No. 8469/DELNP/2009, mailed Dec. 26, 2019, 3 pages.
Notice of Allowance for U.S. Appl. No. 16/390,761, dated Mar. 24, 2020, 7 pages.
International Search Report and Written Opinion for International Patent Application No. PCT/US2019/066721, dated Apr. 24, 2020, 16 pages.
Notice of Allowance for U.S. Appl. No. 11/199,319, dated Oct. 2, 2008, 6 pages.
Non-Final Office Action for U.S. Appl. No. 11/435,913, dated May 21, 2010, 5 pages.
Final Office Action for U.S. Appl. No. 11/435,913, dated Nov. 17, 2009, 8 pages.
Non-Final Office Action for U.S. Appl. No. 11/435,913, dated Mar. 2, 2009, 8 pages.
Final Office Action for U.S. Appl. No. 11/435,913, dated Aug. 15, 2008, 8 pages.
Non-Final Office Action for U.S. Appl. No. 11/435,913, dated Jan. 7, 2008, 7 pages.
Non-Final Office Action for U.S. Appl. No. 11/768,014, dated Jan. 21, 2009, 9 pages.
Non-Final Office for U.S. Appl. No. 11/768,014, dated Mar. 25, 2010, 9 pages.
Non-Final Office for U.S. Appl. No. 11/768,014, dated Jul. 10, 2009, 7 pages.
Notice of Allowance for U.S. Appl. No. 13/187,814, dated Sep. 10, 2012, 8 pages.
Non-Final Office Action for U.S. Appl. No. 11/952,484, dated Jan. 8, 2010, 17 pages.
Final Office Action for U.S. Appl. No. 11/952,484, dated Oct. 5, 2010, 19 pages.
Non-Final Office Action for U.S. Appl. No. 11/952,484, dated Oct. 27, 2011, 22 pages.
Non-Final Office Action for U.S. Appl. No. 13/415,643, dated Jan. 3, 2013, 17 pages.
Quayle Action for U.S. Appl. No. 13/415,643, dated Jul. 11, 2013, 6 pages.
Notice of Allowance for U.S. Appl. No. 13/415,643, dated Aug. 15, 2013, 8 pages.
Non-Final Office Action for U.S. Appl. No. 11/952,513, dated May 10, 2011, 19 pages.
Final Office Action for U.S. Appl. No. 11/952,513, dated Oct. 26, 2011, 16 pages.
Notice of Allowance for U.S. Appl. No. 11/952,513, dated Mar. 6, 2012, 9 pages.
Non-Final Office Action for U.S. Appl. No. 13/117,284, dated Nov. 9, 2011, 12 pages.
Final Office Action for U.S. Appl. No. 13/117,284, dated Feb. 29, 2012, 8 pages.
Notice of Allowance for U.S. Appl. No. 13/117,284, dated May 1, 2012, 8 pages.
Non-Final Office Action for U.S. Appl. No. 11/952,545, dated Oct. 23, 2009, 12 pages.
Non-Final Office Action for U.S. Appl. No. 12/766,347, dated Jun. 29, 2012, 11 pages.
Notice of Allowance for U.S. Appl. No. 11/952,592, dated Aug. 6, 2012, 7 pages.
Non-Final Office Action for U.S. Appl. No. 11/952,592, dated Sep. 19, 2011, 9 pages.
Final Office Action for U.S. Appl. No. 11/952,592, dated Feb. 24, 2011, 9 pages.
Non-Final Office Action for U.S. Appl. No. 11/952,592, dated Dec. 15, 2010, 9 pages.
Non-Final Office Action for U.S. Appl. No. 11/952,592, dated Jul. 28, 2009, 7 pages.
Final Office Action for U.S. Appl. No. 11/952,592, dated Apr. 16, 2010, 8 pages.
Final Office Action for U.S. Appl. No. 11/952,592, dated Jan. 18, 2012, 10 pages.
Non-Final Office Action for U.S. Appl. No. 11/952,592, dated Jun. 12, 2012, 10 pages.
Notice of Allowance for U.S. Appl. No. 11/952,617, dated Jan. 8, 2013, 8 pages.
Notice of Allowance for U.S. Appl. No. 11/952,617, dated Jun. 4, 2012, 9 pages.
Final Office Action for U.S. Appl. No. 11/952,617, dated Feb. 16, 2012, 7 pages.
Non-Final Office Action for U.S. Appl. No. 11/952,617, dated Jul. 28, 2011, 9 pages.
Non-Final Office Action for U.S. Appl. No. 11/952,617, dated Sep. 26, 2008, 10 pages.
Final Office Action for U.S. Appl. No. 11/952,617, dated Nov. 20, 2009, 16 pages.
Non-Final Office Action for U.S. Appl. No. 11/952,634, dated Jun. 13, 2011, 7 pages.
Final Office Action for U.S. Appl. No. 11/952,634, dated Feb. 1, 2011, 7 pages.
Final Office Action for U.S. Appl. No. 11/952,634, dated Dec. 23, 2010, 8 pages.
Non-Final Office Action for U.S. Appl. No. 11/952,634, dated Jul. 21, 2010, 7 pages.
Notice of Allowance for U.S. Appl. No. 13/151,499, dated Dec. 19, 2013, 8 pages.
International Search Report for PCT/US2008/068153, dated Dec. 9, 2008, 3 pages.
Office Action for Chinese Patent Application No. 200880104171.1, dated Jun. 2, 2011, 20 pages.
Second Office Action for Chinese Patent Application No. 200880104171.1, dated Feb. 16, 2012, 8 pages.
Non-Final Office Action for U.S. Appl. No. 11/952,670, dated Jun. 22, 2011, 4 pages.
Non-Final Office Action for U.S. Appl. No. 11/952,670, dated May 27, 2010, 6 pages.
Notice of Allowance for U.S. Appl. No. 11/952,670, dated Oct. 21, 2009, 6 pages.
Notice of Allowance for U.S. Appl. No. 11/952,670, dated Aug. 24, 2012, 7 pages.
Notice of Allowance for U.S. Appl. No. 11/952,690, dated Aug. 30, 2010, 9 pages.
Non-Final Office Action for U.S. Appl. No. 11/952,690, dated Mar. 25, 2010, 9 pages.
Non-Final Rejection for U.S. Appl. No. 12/913,364, dated Feb. 13, 2012, 6 pages.
Notice of Allowance for U.S. Appl. No. 12/913,364, dated Jun. 8, 2012, 8 pages.
Non-Final Office Action for U.S. Appl. No. 13/189,838, dated Mar. 14, 2014, 14 pages.
Final Office Action for U.S. Appl. No. 13/189,838, dated Jun. 19, 2014, 10 pages.
Advisory Action for U.S. Appl. No. 13/189,838, dated Aug. 28, 2014, 2 pages.
Non-Final Office Action for U.S. Appl. No. 13/189,838, dated Oct. 28, 2014, 11 pages.
Final Office Action for U.S. Appl. No. 13/189,838, dated Feb. 20, 2015, 13 pages.
Non-Final Office Action for U.S. Appl. No. 13/034,755, dated Aug. 15, 2013, 6 pages.

(56) References Cited

OTHER PUBLICATIONS

Final Office Action for U.S. Appl. No. 13/034,755, dated Jan. 31, 2014, 10 pages.
Advisory Action for U.S. Appl. No. 13/034,755, dated Mar. 4, 2014, 3 pages.
Notice of Allowance for U.S. Appl. No. 13/034,755, dated Oct. 17, 2014, 7 pages.
Non-Final Office Action for U.S. Appl. No. 13/034,787, dated Jan. 16, 2013, 9 pages.
Final Office Action for U.S. Appl. No. 13/034,787, dated Mar. 19, 2013, 9 pages.
Advisory Action for U.S. Appl. No. 13/034,787, dated May 17, 2013, 3 pages.
Non-Final Office Action for U.S. Appl. No. 13/034,787, dated Aug. 9, 2013, 9 pages.
Final Office Action for U.S. Appl. No. 13/034,787, dated Nov. 15, 2013, 12 pages.
Advisory Action for U.S. Appl. No. 13/034,787, dated Jan. 27, 2014, 4 pages.
Advisory Action for U.S. Appl. No. 13/034,787, dated Feb. 26, 2014, 4 pages.
Notice of Allowance for U.S. Appl. No. 13/034,787, dated May 1, 2014, 9 pages.
Corrected Notice of Allowability for U.S. Appl. No. 13/034,787, dated Jul. 29, 2014, 5 pages.
Non-Final Office Action for U.S. Appl. No. 12/797,381, dated Jan. 8, 2013, 20 pages.
Final Office Action for U.S. Appl. No. 12/797,381, dated May 16, 2013, 19 pages.
Advisory Action for U.S. Appl. No. 12/797,381, dated Jul. 17, 2013, 3 pages.
Examiner's Answer for U.S. Appl. No. 12/797,381, dated Dec. 31, 2013, 6 pages.
Final Office Action for U.S. Appl. No. 13/036,272, dated Oct. 20, 2014, 6 pages.
Advisory Action for U.S. Appl. No. 13/036,272, dated Jan. 8, 2015, 3 pages.
Author Unknown, "Cho-Shield Conductive Coatings," Chomerics—EMI Products, Copyright: 2001, 1 page, Retrieved from http://www.chomerics.com/products/choshield_coatings.htm.
Author Unknown, "Cho-Shield Conductive Coatings," Chomerics: A Division of Parker Hannifin Corporation, Dec. 8, 2000, 3 pages, Retrieved from: http://www.chomerics.com/products/choshield_coatings.htm.
Author Unknown, "Fractional-N RF Synthesizer with Modulator and Digital IF Filter (RF6001)," RF Micro Devices: Part of the Polaris Total Radio Solution, 2005, 2 pages.
Notice of Allowance for U.S. Appl. No. 13/189,838, dated May 4, 2015, 8 pages.
Notice of Allowance for U.S. Appl. No. 13/189,838, dated Jul. 30, 2015, 5 pages.
Non-Final Office Action for U.S. Appl. No. 13/036,272, dated Apr. 14, 2015, 7 pages.
Non-Final Office Action for U.S. Appl. No. 14/447,847, dated May 7, 2015, 7 pages.
Final Office Action for U.S. Appl. No. 14/447,847, dated Sep. 14, 2015, 8 pages.
Non-Final Office Action for U.S. Appl. No. 13/906,892, dated Aug. 10, 2015, 10 pages.
International Preliminary Report on Patentability and Written Opinion for International Patent Application No. PCT/US2008/068153, dated Jan. 5, 2010, 6 pages.
Non-Final Office Action for U.S. Appl. No. 14/595,401, dated Mar. 28, 2016, 14 pages.
Examination Report for Indian Patent Application No. 8469/DELNP/2009, dated Apr. 11, 2017, 7 pages.
Final Office Action for U.S. Appl. No. 14/595,401, dated Oct. 6, 2016, 15 pages.
Notice of Allowance for U.S. Appl. No. 14/595,401, dated Jan. 6, 2017, 8 pages.
Non-Final Office Action for U.S. Appl. No. 14/750,384, dated Aug. 10, 2017, 9 pages.
Notice of Allowance for U.S. Appl. No. 14/750,384, dated Nov. 22, 2017, 8 pages.
Decision on Appeal for U.S. Appl. No. 12/797,381, mailed Mar. 11, 2016, 6 pages.
Final Office Action for U.S. Appl. No. 13/036,272, dated Nov. 19, 2015, 9 pages.
Advisory Action for U.S. Appl. No. 13/036,272, dated Feb. 5, 2016, 3 pages.
Non-Final Office Action for U.S. Appl. No. 13/036,272, dated Apr. 8, 2016, 7 pages.
Notice of Allowance for U.S. Appl. No. 13/036,272, dated Sep. 30, 2016, 5 pages.
Final Office Action for U.S. Appl. No. 14/447,847, dated Dec. 11, 2015, 8 pages.
Non-Final Office Action for U.S. Appl. No. 16/390,761, dated Aug. 20, 2020, 9 pages.
Non-Final Office Action for U.S. Appl. No. 16/893,941, dated Sep. 23, 2020, 8 pages.
Non-Final Office Action for U.S. Appl. No. 16/417,815, dated Sep. 16, 2020, 14 pages.
Final Office Action for U.S. Appl. No. 16/390,761, dated Dec. 28, 2020, 8 pages.
Advisory Action for U.S. Appl. No. 16/390,761, dated Feb. 25, 2021, 3 pages.
Notice of Allowance for U.S. Appl. No. 16/893,941, dated Feb. 26, 2021, 7 pages.
Non-Final Office Action for U.S. Appl. No. 16/579,080, dated Dec. 10, 2020, 9 pages.
Non-Final Office Action for U.S. Appl. No. 16/390,761, dated Apr. 15, 2021, 6 pages.
Notice of Allowance for U.S. Appl. No. 16/579,080, dated Apr. 22, 2021, 7 pages.
Non-Final Office Action for U.S. Appl. No. 16/417,815, dated Mar. 22, 2021, 15 pages.
International Preliminary Report on Patentability for International Patent Application No. PCT/US2019/066721, dated Jul. 1, 2021, 10 pages.

* cited by examiner

SEGMENTED SHIELDING USING WIREBONDS

RELATED APPLICATIONS

This application claims the benefit of provisional patent application Ser. No. 62/679,178, filed Jun. 1, 2018, the disclosure of which is hereby incorporated herein by reference in its entirety.

FIELD OF THE DISCLOSURE

This application relates to shielding for integrated circuit devices.

BACKGROUND

Many electronic devices include multiple components, including integrated circuit (IC) modules. Such components are often mounted to circuit boards in order to provide various functionalities. Such IC modules may have need to suppress spurious noise fields.

SUMMARY

The present disclosure relates to segmented shielding using wirebonds. In an exemplary aspect, a shield is formed from a series of wires (e.g., wirebonds) to create a wall and/or shielded compartment in an integrated circuit (IC) module. The wires can be located in any area within the IC module. The IC module may be overmolded with an insulating mold compound, and a top surface of the insulating mold can be ground or otherwise removed to expose ends of the wires to a shield layer which surrounds the insulating mold. Some examples may further laser ablate or otherwise form cavities around the ends of the wires to create stronger bonding between the wires of the shield and the shield layer.

An exemplary embodiment relates to a method for forming a shielded compartment in an IC module. The method includes providing a module substrate and forming an electromagnetic shield. Forming the electromagnetic shield includes placing a first series of wires to form a first wall separating a shielded compartment from a portion of the module substrate and bonding the first series of wires to a conductive plate in the module substrate. The method also includes depositing an insulating mold over the module substrate and depositing a shield layer over the insulating mold, the shield layer contacting an exposed end of each of the first series of wires.

Another exemplary embodiment relates to an IC module having a shielded compartment. The IC module includes a substrate comprising a ground conductor and an electromagnetic shield, comprising a first wall formed from a first series of wires bonded to the ground conductor. The IC module also includes an insulating mold disposed over the substrate and a shield layer disposed over the insulating mold and in contact with ends of each of the first series of wires.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
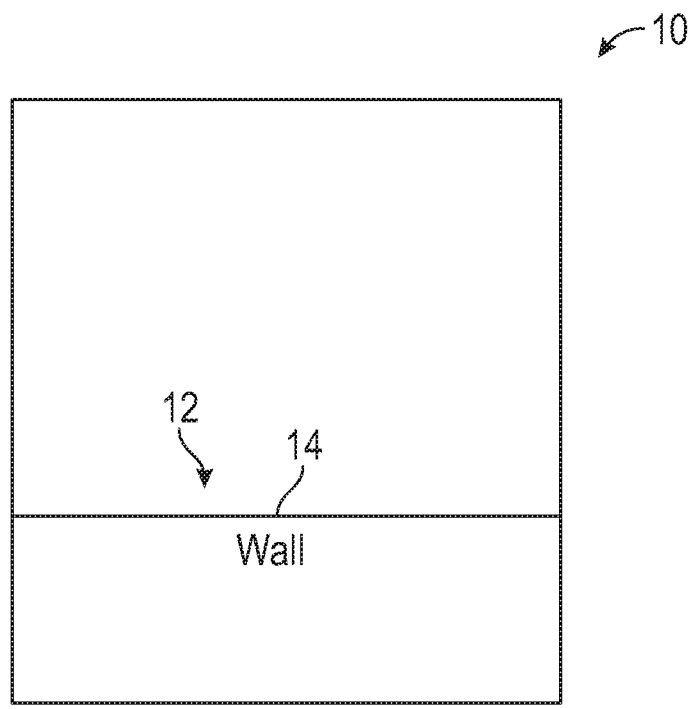
FIG. 1A is a schematic diagram of an exemplary integrated circuit (IC) module, which includes an electromagnetic shield forming a wall.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to segmented shielding using wirebonds. In an exemplary aspect, a shield is formed from a series of wires (e.g., wirebonds) to create a wall and/or shielded compartment in an integrated circuit (IC) module. The wires can be located in any area within the IC module. The IC module may be overmolded with an insulating mold compound, and a top surface of the insulating mold can be ground or otherwise removed to expose ends of the wires to a shield layer which surrounds the insulating mold. Some examples may further laser ablate or otherwise form cavities around the ends of the wires to create stronger bonding between the wires of the shield and the shield layer.

FIG. 1A is a schematic diagram of an exemplary IC module 10, which includes an electromagnetic shield 12 forming a wall 14. It may be desirable to dampen spurious noise fields (e.g., undesired electromagnetic interferences) within the IC module 10. The electromagnetic shield 12 is provided to form the wall 14 between portions of the IC module 10 needing separate shielding. For example, the IC module 10 may include a first IC which causes noise that interferes with a second IC, and the electromagnetic shield 12 may separate and electromagnetically isolate these ICs from each other.

Figure 1B:
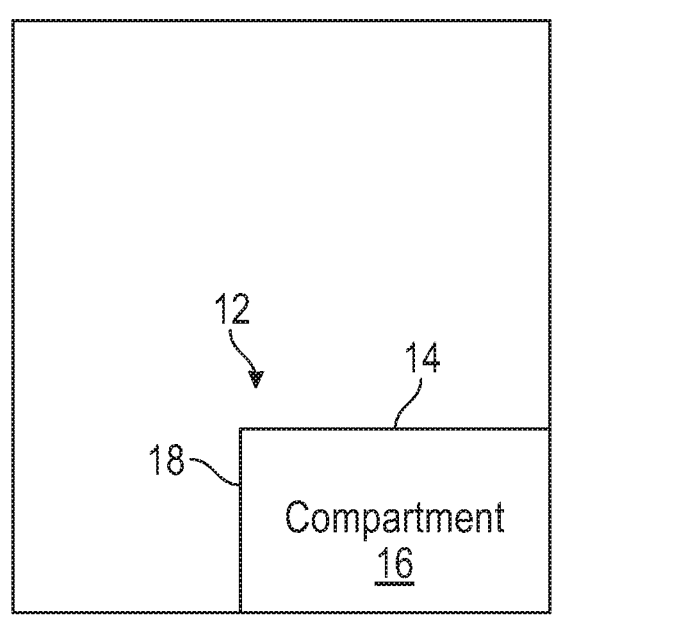
FIG. 1B is a schematic diagram of another exemplary IC module, which includes the electromagnetic shield forming a shielded compartment.

FIG. 1B is a schematic diagram of another exemplary IC module 10, which includes the electromagnetic shield 12 forming a shielded compartment 16. In this regard, the shielded compartment 16 may electromagnetically isolate the shielded compartment 16 from other portions of the IC module 10. This may reduce electromagnetic interference entering and/or leaving the shielded compartment 16. In the example depicted in FIG. 1B, the electromagnetic shield 12 includes a first wall 14 and a second wall 18 defining the shielded compartment 16.

It should be understood that the electromagnetic shield 12 can include any number of walls 14, 18, and that the walls may be any geometric shape and/or meet at different angles.

It should be further understood that while FIGS. 1A and 1B are depicted with walls 14, 18 which extend to edges of the IC module 10 and fully enclose the shielded compartment 16, other examples may not extend to these edges, and the compartment 16 may not be fully enclosed by these walls 14, 18. An exemplary process of forming the electromagnetic shield 12 and additional details are further described below with respect to FIGS. 2A-2E. An exemplary IC module 10 having the electromagnetic shield 12 is illustrated in greater detail in FIG. 3.

Figure 2A:
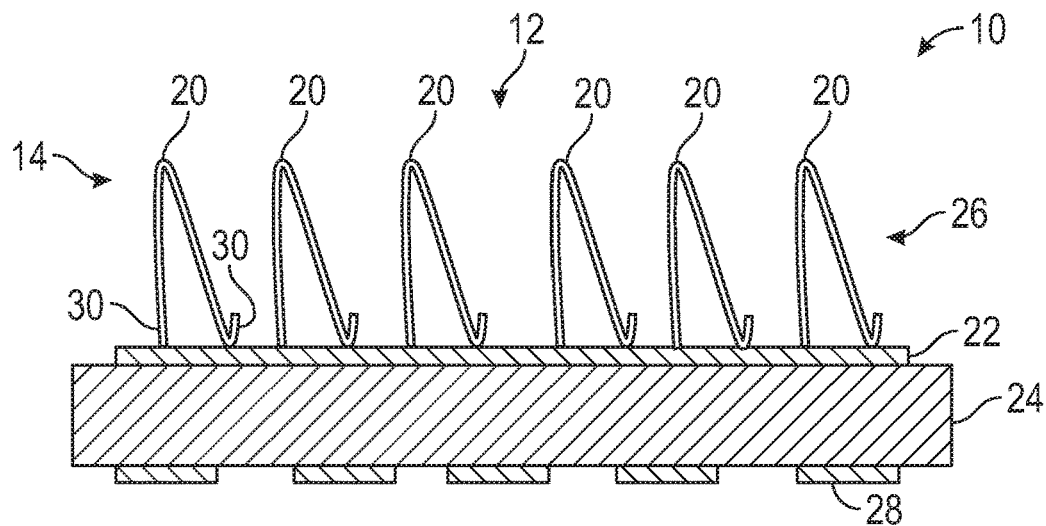
FIG. 2A is a cross-sectional view of the exemplary IC module of FIG. 1A or FIG. 1B, illustrating bonding wires of the electromagnetic shield to a conductive plate.

FIG. 2A is a cross-sectional view of the exemplary IC module 10 of FIG. 1A or FIG. 1B, illustrating bonding wires 20 of the electromagnetic shield 12 to a conductive plate 22. In this regard, the electromagnetic shield 12 is formed by providing a module substrate 24 and placing a first series of wires 26 to form a wall 14 (e.g., a first wall) separating the shielded compartment 16 from a portion of the module substrate 24 (e.g., as shown in FIG. 1A or FIG. 1B). The first series of wires 26 is bonded to the conductive plate 22 in the module substrate 24.

The module substrate 24 may be a printed circuit board or other laminate having a number of layers. These layers of the module substrate 24 may include prepreg material. The conductive plate 22 may be a ground plate or similar element formed on or in the layers of the module substrate 24 (using an appropriate conductive material, such as gold, silver, copper, etc.). The module substrate 24 can also include module contacts 28 and other conductive elements, via structures, and the like, which may be formed from the same or another appropriate conductive material. The IC module 10 may be a single-sided IC module 10 (e.g., having ICs and other components coupled to only one side of the module substrate 24), or it may be a double-sided IC module (e.g., having ICs and other components coupled to a top and bottom side of the module substrate 24).

The wires 20 of the electromagnetic shield 12 can be formed from an appropriate conductive material, such as palladium coated copper, copper, gold, silver, or aluminum. The wires 20 may be between 0.6 mil and 2.0 mil diameter having wire loops whose ends 30 are bonded to the conductive plate 22 through an appropriate technique, such as ultrasonic bonding (e.g., ball bonding, wedge bonding), compliant bonding, soldering, combinations of these techniques, and so on. The bonded ends 30 of the wires 20 are generally separated from one another, but still function to electromagnetically isolate the shielded compartment 16. In an exemplary aspect, each of the wires 20 spans 350 microns (μm) to 550 μm, and the bonded ends 30 of the wires 20 are separated by at least 80 μm.

With reference to FIG. 1B and FIG. 2A, second and/or additional walls of the electromagnetic shield 12 can be formed by placing a second and/or additional series of wires separating the shielded compartment 16 from other portions of the module substrate 24. The second and/or additional series of wires is further bonded to the conductive plate 22 in a similar manner as the first series of wires 26. It should be understood that the process further described in FIGS. 2B-2E can be similarly applied to this second and/or additional walls.

Figure 2B:
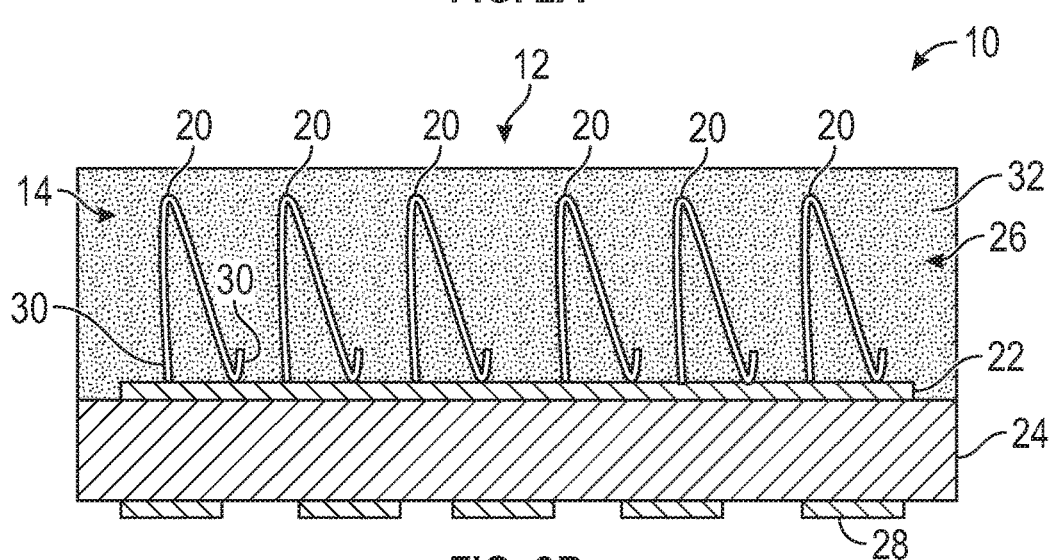
FIG. 2B is another cross-sectional view of the exemplary IC module of FIG. 2A, illustrating encapsulating the IC module in an insulating mold.

FIG. 2B is another cross-sectional view of the exemplary IC module 10 of FIG. 2A, illustrating encapsulating the IC module 10 in an insulating mold 32. The insulating mold 32 is applied over the module substrate 24 (e.g., over the top side of the module substrate 24) to encapsulate each electronic component on the surface of the module substrate 24 and the electromagnetic shield 12. The insulating mold 32 may be an organic epoxy resin or similar material deposited at a thickness of 350 µm or greater. The insulating mold 32 may be applied by various procedures, such as sheet molding, overmolding, compression molding, transfer molding, dam fill encapsulation, or screen print encapsulation. In an exemplary aspect, the insulating mold 32 fills any space below the wires 20. A curing process hardens the insulating mold 32.

Figure 2C:
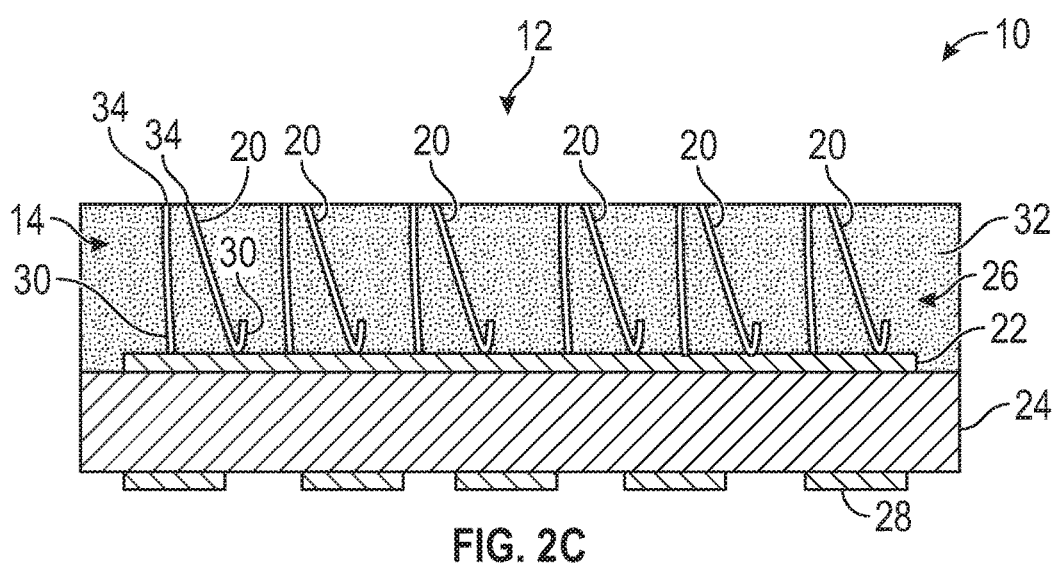
FIG. 2C is another cross-sectional view of the exemplary IC module of FIG. 2A, illustrating removing a top surface of the insulating mold.

FIG. 2C is another cross-sectional view of the exemplary IC module 10 of FIG. 2A, illustrating removing a top surface of the insulating mold 32. A portion of the insulating mold 32 is removed to expose ends 34 (e.g., top ends) of the wires 20 (e.g., the first series of wires 26). The ends 34 are exposed through an appropriate technique, such as by strip level grinding the top surface of the insulating mold 32 (e.g., to a thickness of 320 µm) and the wires 20 such that each wire loop is cut in half. In some examples, the insulating mold 32 deposition process can leave the ends 34 exposed without grinding, or another removal process (e.g., chemical or mechanical) can be used.

Figure 2D:
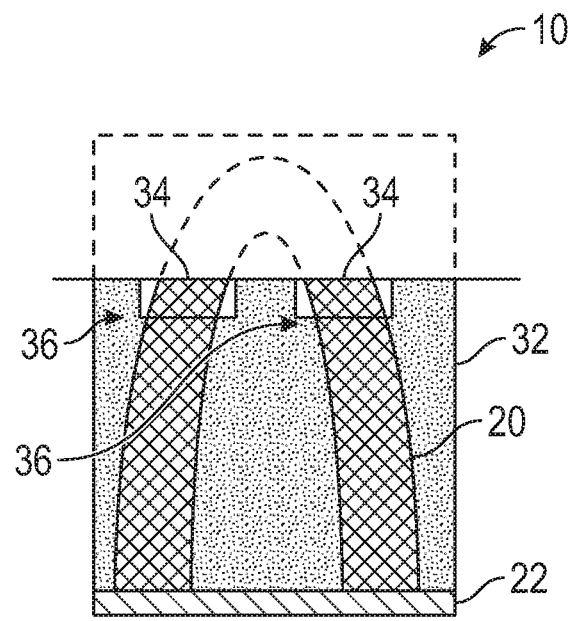
FIG. 2D is another cross-sectional view of the exemplary IC module of FIG. 2A, illustrating forming a cavity around the wires of the electromagnetic shield.
Figure 2E:
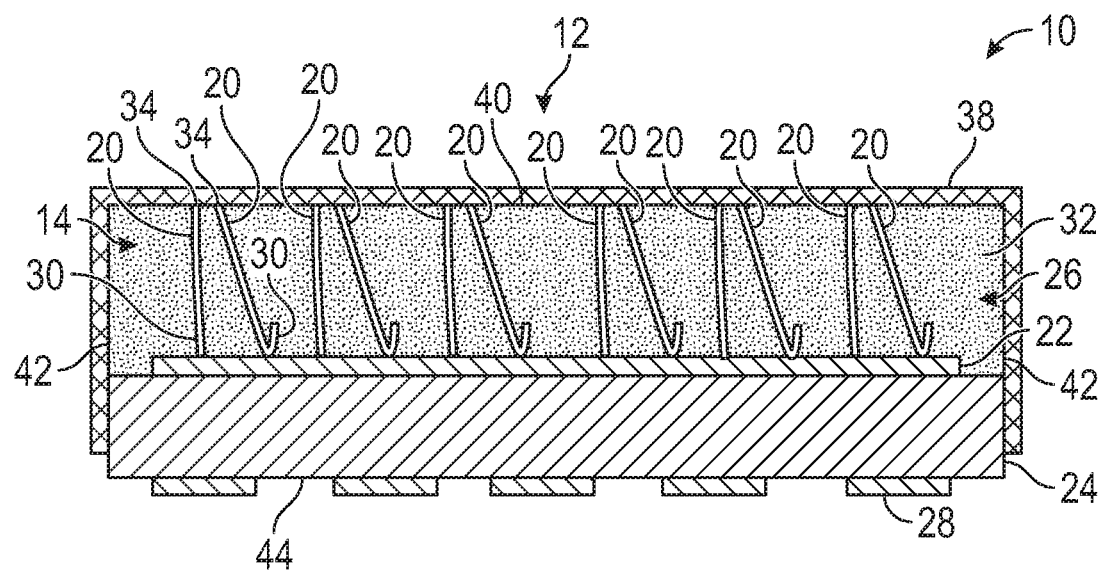
FIG. 2E is another cross-sectional view of the exemplary IC module of FIG. 2A, illustrating forming a shield layer over the IC module.

FIG. 2D is another cross-sectional view of the exemplary IC module 10 of FIG. 2A, illustrating forming a cavity 36 around the wires 20 of the electromagnetic shield 12. As shown in FIG. 2E, the exposed ends 34 of the wires 20 are bonded to a shield layer 38 over the insulating mold 32. This bonding can be improved by first forming the cavity 36 around each exposed end 34 to increase a surface area of the wires 20 for bonding (e.g., by exposing sides of the wires 20 in addition to the exposed ends 34). In an exemplary aspect, the cavity 36 is formed by laser ablating about each of the exposed ends 34 of the wires 20. Other techniques may also be applied, such as mechanical removal (e.g., water jets, grinding), ion milling, chemical removal, and so on. The cavity 36 may be between 1 µm and 20 µm about each wire 20, and may be from 1 µm to 10 µm deep. The cavity 36 can further be cleaned in a chemical bath (e.g., with a permanganate etchant) and/or plated with an electroless or electroless/electrolytic plating process.

FIG. 2E is another cross-sectional view of the exemplary IC module 10 of FIG. 2A, illustrating forming the shield layer 38 over the IC module 10. The shield layer 38 is deposited over the insulating mold 32 and contacts the exposed ends 34 of the wires 20 (e.g., the first series of wires 26). The shield layer 38 can be deposited by plating the insulating mold 32 and the exposed ends 34, sputtering a conductive material over the insulating mold 32 and the exposed ends 34, or another appropriate technique (e.g., applying a conductive paint or ink). In some examples, the shield layer 38 can be formed separately and coupled to the insulating mold 32 and the exposed ends 34 of the wires 20.

The shield layer 38 can include a single layer of material, or it can include multiple layers of the same or different materials. For example, an interior layer (e.g., in contact with the insulating mold 32) may be formed of copper, aluminum, silver, gold, or other conductive materials with a thickness between 3 µm and 16 µm. An exterior layer may reside over the interior layer, and may be formed of nickel with a thickness between 1 µm and 3 µm.

In an exemplary aspect, the shield layer 38 entirely covers a top surface 40 of the IC module 10 and entirely or almost entirely covers a side surface 42 of the IC module 10. The shield layer 38 does not cover a bottom side 44 of the IC module 10. Herein and hereafter, entirely covering a surface refers to covering at least 99% of the surface, while almost entirely covering a surface refers to covering at least 90% of the surface.

Figure 3:
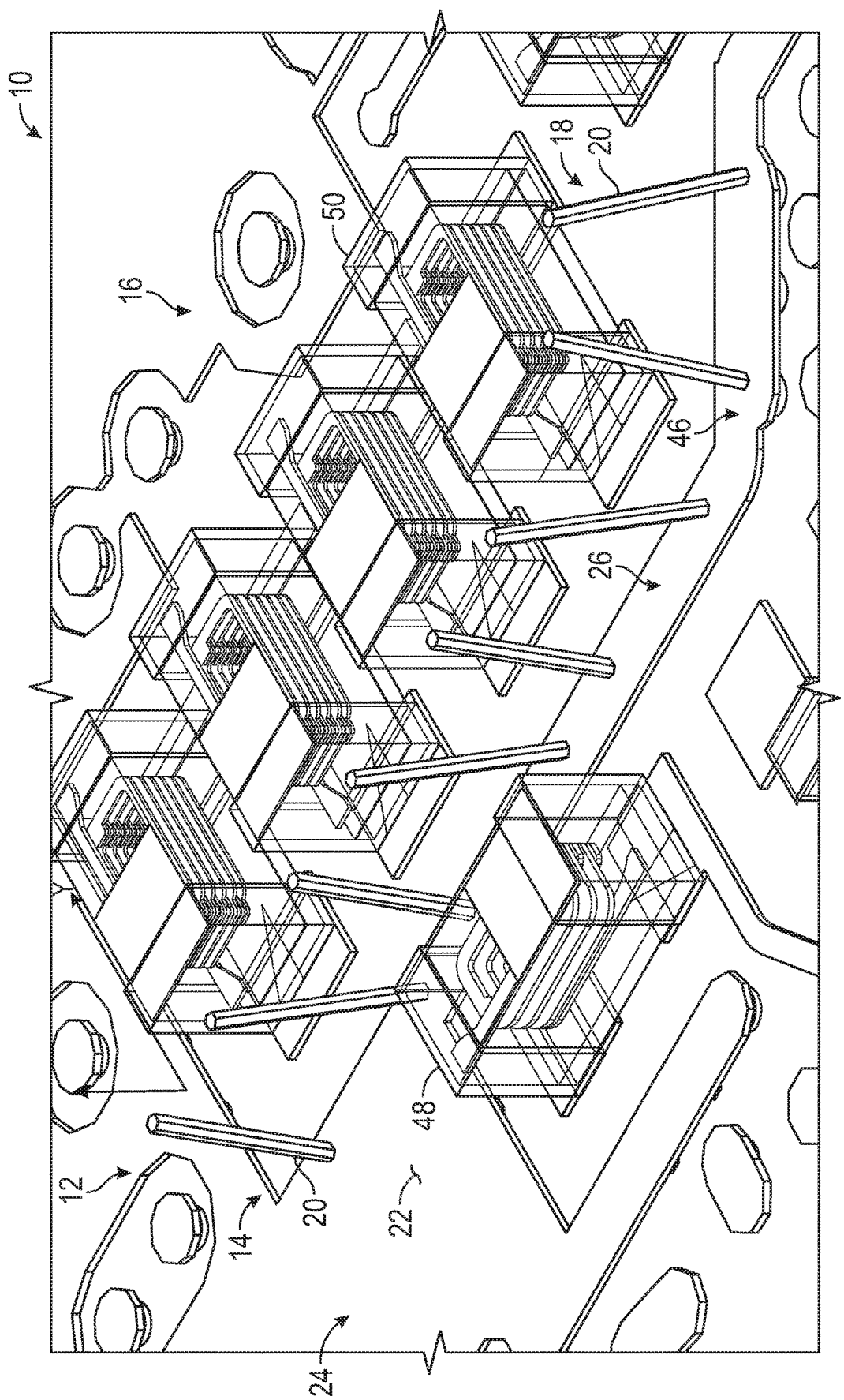
FIG. 3 is a transparent isometric view of the exemplary IC module of FIG. 1A or FIG. 1B.

FIG. 3 is a transparent isometric view of the exemplary IC module 10 of FIG. 1A or FIG. 1B. In this regard, the electromagnetic shield 12 forms the shielded compartment 16 to electromagnetically isolate the shielded compartment 16 from other portions of the IC module 10. In the example depicted in FIG. 3, the electromagnetic shield 12 includes the first wall 14 and the second wall 18. The first wall 14 includes the first series of wires 26 bonded to the conductive plate 22, and the second wall 18 includes a second series of wires 46 bonded to the conductive plate 22. The electromagnetic shield 12 separates a first component 48 (e.g., a first IC, capacitor, inductor, etc.) coupled to the module substrate 24 from a second component 50 (e.g., a second IC, capacitor, inductor, etc.) coupled to the module substrate 24. It should be understood that various combinations of components, including ICs, can be coupled to the top and/or bottom surface of the module substrate 24, and one or more electromagnetic shields 12 can be formed to provide suppression of spurious noise fields as needed. In some examples, the wires 20 may be bonded between a component 48, 50 and the shield layer 38.

Those skilled in the art will recognize improvements and modifications to the preferred embodiments of the present disclosure. All such improvements and modifications are considered within the scope of the concepts disclosed herein and the claims that follow.

What is claimed is:

1. A method for forming a shielded compartment in an integrated circuit (IC) module, comprising:
   providing a module substrate;
   forming an electromagnetic shield, comprising:
      placing a first series of three or more wires to form a first wall separating the shielded compartment from a portion of the module substrate; and
      bonding the first series of three or more wires to a conductive plate in the module substrate;
   depositing an insulating mold over the module substrate;
   forming a plurality of cavities into the insulating mold, each of the plurality of cavities surrounding an exposed end of one of the first series of three or more wires; and
   depositing a shield layer over and at least partially surrounding the insulating mold, the shield layer contacting the exposed end of each of the first series of three or more wires.

2. The method of claim 1, wherein bonding the first series of three or more wires to the conductive plate further comprises bonding ends of a plurality of wire loops to the conductive plate.

3. The method of claim 2, wherein the ends of the plurality of wire loops are separated from nearby ends of the plurality of wire loops.

4. The method of claim 1, wherein the insulating mold surrounds each of the first series of three or more wires.

5. The method of claim 1, wherein forming the plurality of cavities into the insulating mold comprises laser ablating each into the insulating mold about each of the exposed ends of the first series of three or more wires to further expose each of the first series of three or more wires before depositing the shield layer.

6. The method of claim 1, further comprising grinding the insulating mold and each of the first series of three or more wires to cut each of the first series of three or more wires to form the exposed ends and form a planar surface which includes the exposed ends of the first series of three or more wires.

7. The method of claim 6, wherein the plurality of cavities into the insulating mold are formed in the planar surface.

8. The method of claim 1, wherein depositing the shield layer comprises at least one of plating the insulating mold or sputtering a conductive material over the insulating mold.

9. The method of claim 1, wherein forming the electromagnetic shield electromagnetically isolates the shielded compartment from the portion of the module substrate.

10. The method of claim 1, wherein forming the electromagnetic shield further comprises:
placing a second series of three or more wires to form a second wall separating the shielded compartment from the portion of the module substrate; and
bonding the second series of three or more wires to the conductive plate in the module substrate;
wherein each of the first wall and the second wall is a linear wall of three or more wires.

11. An integrated circuit (IC) module having a shielded compartment, the IC module comprising:
a substrate comprising a ground conductor;
an electromagnetic shield comprising a first wall formed from a first series of three or more wires bonded to the ground conductor;
an insulating mold disposed over the substrate;
a plurality of cavities in the insulating mold, each of the plurality of cavities surrounding an exposed end of one of the first series of three or more wires; and
a shield layer disposed over and at least partially surrounding the insulating mold and in contact with the exposed end of each of the first series of three or more wires.

12. The IC module of claim 11, wherein:
the substrate comprises a printed circuit board; and
the IC module further comprises a first IC and a second IC each coupled to a surface of the printed circuit board.

13. The IC module of claim 12, wherein the electromagnetic shield separates and electromagnetically isolates the first IC from the second IC.

14. The IC module of claim 11, wherein the insulating mold surrounds and separates each of the first series of three or more wires in the first wall.

15. The IC module of claim 11, wherein:
the first series of three or more wires is bonded to the ground conductor with an ultrasonic bond; and
each of the first series of three or more wires is cut to form the exposed ends.

16. The IC module of claim 11, wherein each of the plurality of cavities in the insulating mold is at least partially filled with the shield layer.

17. The IC module of claim 16, wherein each cavity is between 1 micron (μm) and 20 μm about one of the first series of three or more wires.

18. The IC module of claim 11, wherein the shield layer comprises at least one of an electroless plating, an electroless/electrolytic plating, a sputtered conductive layer, or a conductive paint.

19. The IC module of claim 16, wherein each of the first series of three or more wires comprises 0.6 mil to 2.0 mil diameter of at least one of gold wire or palladium coated copper wire.

20. The IC module of claim 11, wherein:
the electromagnetic shield further comprises a second wall formed from a second series of three or more wires bonded to the ground conductor; and
each of the first wall and the second wall is a linear wall of three or more wires.

* * * * *